United States Patent [19]
Lee

[11] Patent Number: 5,872,379
[45] Date of Patent: Feb. 16, 1999

[54] LOW VOLTAGE TURN-ON SCR FOR ESD PROTECTION

[75] Inventor: Jian-Hsing Lee, Hsin-Chu, Taiwan

[73] Assignee: Taiwan Semiconductor Manufacturing Co. Ltd., Hsin-Chu, Taiwan

[21] Appl. No.: 891,462

[22] Filed: Jul. 10, 1997

[51] Int. Cl.$^6$ .................................................. H01L 23/62
[52] U.S. Cl. ........................ 257/355; 257/356; 257/357
[58] Field of Search .................................. 257/173, 355, 257/357, 361

[56] References Cited

U.S. PATENT DOCUMENTS

| | | | |
|---|---|---|---|
| 5,019,888 | 5/1991 | Scott et al. | 257/355 |
| 5,182,220 | 1/1993 | Ker et al. | 438/199 |
| 5,218,222 | 6/1993 | Roberts | 257/362 |
| 5,235,201 | 8/1993 | Honna | 257/355 |
| 5,329,143 | 7/1994 | Chan et al. | 257/173 |

OTHER PUBLICATIONS

"Internal Chip ESD Phenomean a Beyond the Protection Circuit", C. Duvvury, IEEE Transactions on Electron Devices, vol. 35, No. 12, Dec. 1988.

"A Low–Voltage Triggering SCR for On–Chip ESD Protection at Output and Input Pads", A. Chatterjee, IEEE Electron Device Letters, vol.12, No. 1, Jan. 1991.

"ESD Protection in a Mixed Voltage Inteface and Multi–Rail Disconnected Power Grid Environment in 0.50– and 0.25–$\mu$m Channel Length CMOS Technologies", S. Voldman, EOS/ESD Symposium Proceedings, pp. 125–134, 1994.

*Primary Examiner*—Wael Fahmy

[57] ABSTRACT

An apparatus and method are disclosed for enhancing the operation of an ESD protective circuit in a VLSI chip with a combination of elements for an SCR that lower the turn-on voltage of the SCR below the oxide breakdown voltage of the CMOS devices in the VLSI circuits. A low voltage trigger source is provided for the SCR by forming an N+–P-LDD junction between the SCR and a CMOS device incorporated therein. The prior art N-channel device used in triggering the known LVTSCR is modified by removing the rate electrode and thin oxide and implanting, adjacent the N+ drain region, a P-type lightly doped drain (P-LDD) region in the substrate to form the N+–P-L.DD junction. The turn-on voltage of this N+–P-LDD junction can be made lower than the oxide breakdown voltage of the CMOS devices by adjusting the P-LDD dosage. Junction breakdown causes a forward bias resulting in turn ON of the PNP bipolar device followed by turn ON of the interconnected NPN bipolar device to produce the high current flow through the SCR. Concern about damage to the gate oxide of the prior art NMOS is obviated as there is no longer a gate oxide.

14 Claims, 1 Drawing Sheet

LOW VOLTAGE TURN-ON SCR FOR ESD PROTECTION

FIELD OF THE INVENTION

The present invention generally relates to electrostatic discharge (FSD) stress protection devices for VLSI semiconductor circuits and, more particularly, to a low voltage turn-on SCR for on-chip ESD protection of semiconductor circuits that utilizes an N+ and P-LDD junction to form the trigger source.

BACKGROUND OF THE INVENTION

With recent advances in the development of high density very large scale integration (VLSI) circuits, the dimensions of the devices continue to shrink resulting in a corresponding decrease in the gate oxide thicknesses in the CMOS devices. This decrease, relative to breakdown voltage, has resulted in the greater susceptibility of these devices to damage from the application of excessive voltages such as caused by an electrostatic discharge (ESD) event. During an ESD event, charge is transferred between one or more pins of the integrated circuits and another conducting object in a short period of time, typically less than one microsecond. The charge transfer generates voltages that are large enough to break down insulating films, e.g., gate oxides on MOSFET devices, or that can dissipate sufficient energy to cause electrothermal failures in the devices. Such failures include contact spiking, silicon melting, or metal interconnect melting. Consequently, in order to deal with transient ESD pulses, an integrated circuit must incorporate protection circuits at every input and I/O pin. Various circuit structures for ESD protection can be found, e.g., in U.S. Pat. Nos. 5,019,888 to Scott et al; 5,182,220 to Ker et al, 5,218,222 to Roberts; and 5,329,143 to Chan; and in the literature in "Internal Chip ESD Phenomena Beyond the Protection Circuit", C. Duvvury, IEEE Transactions on Electron Devices, Vol .35, No. 12, December 1988; "A Low-Voltage Triggering SCR for On-Chip ESD Protection at Output and Input Pads", A. Chatterjee, IEEE Electron Device Letters, Vol. 12, No. 1, January 1991; and "ESD Protection in a Mixed Voltage Interface and Multi-Rail Disconnected Power Grid Environment in 0.50- and 0.25-$\mu$m Channel Length CMOS Technologies", S. Voldman, EOS/ESD Symposium Proceedings, pp. 125–134, 1994.

An example of one form of ESD protection device of the type discussed in the above-cited "A Low-Voltage Triggering SCR for On-Chip ESD Protection at Output and Input Pads", A. Chatterjee, IEEE Electron Device Letters, Vol. 12, No. 1, January 1991 paper is shown in FIG. 1, which is a cross-sectional view of a known low-voltage threshold silicon controlled rectifier (LTVSCR) integrated circuit (IC) device 10 fabricated from a semiconductor substrate 12 of a first conductivity type, such as P-type conductivity, with various diffusions and circuit components formed thereon to provide protection against ESD damage due to excessive stresses. The SCR is known in the art as an ideal device for on-chip protection against ESD since in its ON state it protects sensitive devices by virtue of its comparatively low resistance. Also, the failure threshold of the SCR is high because the heat generation is distributed over a large volume. However, there are sensitive devices that are damaged at voltages less than the SCR trigger voltage, which typically is comparatively high, so that the SCR alone is insufficient for protecting devices such as NMOS transistors which have the lowest breakdown voltage in CMOS technology. For example, the trigger voltage of a lateral SCR is approximately 50 V, as compared to an NMOS transistor drain breakdown voltage of less than 15 V. To achieve a reduction of the SCR trigger voltage to a level less than the NMOS breakdown voltage, an NMOS-like structure is incorporated in the SCR device as a trigger. Accordingly, a thin-oxide NMOS field-effect transistor (MOSFET) 26, is shown in the FIG. 1 device in the form of an N-channel device, composed of N+ regions, 18 and 20, having a gate electrode 22 with a thin oxide 24 therebetween. The inner N+ region 20 of MOSFET 26 is connected to internal circuits 30 and its outer N+ region 18 is coupled to an adjacent outer P+ conductivity region 14 by a contact or bus 16 which is connected to a negative voltage source VSS or ground. The Vss source is also coupled to the gate electrode 22 to keep the LVTSCR OFF during normal operation. In the absence of the SCR, the NMOS thick-field device 26 would deal with either positive or negative ESD stresses developed between the Vss voltage on contact 16 and the voltage communicated from the internal circuits 30. The N+ diffusion regions, 18 and 20, and underlying P-type substrate 12 act as a bipolar device when there is an excessive positive stress on the internal circuit 30 with respect to Vss, i.e., a parasitic lateral NPN transistor results, with its base at the substrate 12, its emitter at N+ region 18, and its collector or drain at N+ region 20. The NP junction (20,12) at the drain breaks down, typically at about 13 volts, to offer protection to the other circuit devices, and the generated electrons are swept into the collector region 20. The generated holes injected into the base region 12 cause the substrate voltage to increase, forward biasing the emitter junction, and causing the NPN transistor to turn ON. As a consequence, injection of electrons from the emitter 18 into the base 12 is increased and those electrons reaching the collector-base junction (20,12) generate new electron hole pairs and current growth continues. This "positive feedback" would cause the emitter-to-collector current to increase indefinitely, resulting in damage to the device if the current is not somehow limited. Also, in the absence of the SCR, when a negative stress on the internal circuit with respect to Vss occurs, a forward biased diode would result between P+ region 14 and N+ region 20, through the substrate 12, that would turn ON to protect the other internal integrated devices.

To complete the LVTSCR, an N-well 28 is provided in substrate 12 that substantially overlaps N+ region 20 and extends laterally beyond a second N+ region 32 which is coupled to an adjacent inner P+ conductivity region 34 by a contact or bus 36 connected to an I/O Pad. N-well 28 increases the junction breakdown voltage between N+ region 20 and the substrate 12, and alleviates the chances of contact spiking produced by the N+ junction and thus avoids short circuiting of the N+ junction to the P-substrate. Moreover, even were a breakdown to occur in the N+ junction, the increased cross-sectional area of the N-well 28 available for current flow decreases the current density and thus improves the ESD immunity. In this arrangement the NMOS-like device acts as a trigger for the SCR. The internal circuits connection acts as a "drain tap"and the N+ region 18 source as a cathode, and the charge generated during avalanche breakdown near the drain tap triggers the LVTSCR. Prior to triggering, the LVTSCR characteristics resemble that of an NMOS with the same gate length, and since for short channel MOSFETs the drain breakdown voltage decreases with reduction of the gate length, if the gate length of the LVTSCR is kept less than that of an NMOS of the output buffer in parallel with it and at the same potential, then the LVTSCR will fire first and protect the NMOS.

There exists a danger, since the N-well is lightly doped, that the SCR turn-on voltage may still be so high that the gate oxide of NMOS devices may become damaged. Thus, the LVTSCR device turn-on voltage is dependent on the NMOS beakdown voltage. It is therefore desirable to be able to reduce the trigger voltage required to turn ON a protective SCR as much as possible.

It is therefore an object of the present invention to provide an enhanced ESD protection performance apparatus and method for protecting VLSI circuits and particularly CMOS devices by reducing the trigger voltage required to turn ON a protective SCR.

It is another object of the present invention to provide an enhanced ESD protection performance apparatus and method utilizing an improved SCR structure with a low turn-on voltage.

It is a further object of the present invention to provide an improved SCR for enhanced ESD protection performance using a P-LDD dosage in the SCR trigger structure to create an N+–P-LDD junction with a reduced breakdown voltage.

SUMMARY OF THE INVENTION

The present invention involves an apparatus and method embodied in an improved combination of elements for an SCR, used as an ESD protection device in VLSI circuits, to lower the turn-on voltage of the SCR below the oxide breakdown voltage of the CMOS devices in the VLSI circuits. A low voltage trigger source is provided for the SCR by forming an N+–P-LDD junction between the SCR and a CMOS device incorporated therein. In particular, the prior art N-channel device used in triggering the known LVTSCR is modified by removing the gate electrode and thin oxide and implanting, adjacent the N+ drain region, a P-type lightly doped drain (P-LDD) region in the substrate to form an N+–P-LDD junction. The turn-on voltage of this N+–P-LDD junction can be made lower than the oxide breakdown voltage of the CMOS devices by adjusting the P-LDD dosage, and the junction upon breakdown will support a high current flow. Junction breakdown causes a forward bias resulting in turn ON of the PNP bipolar device followed by turn ON of the interconnected NPN bipolar device to produce the high current flow through the SCR.

There no longer need be a concern about damage to the gate oxide of the prior art NMOS as there is no longer a gate oxide. The implantation may use boron ions, such as B⁻ or $BF_2$, as the P-type ions, with energies in the range from about 40 Kev. to about 60 Kev. and a dosage of from about $100^{11}$ to about $10^{15}$ ions/cm².

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides an apparatus and method for protecting VLSI circuits, and particularly CMOS devices therein, from ESD damage and which are embodied in an improved combination of elements that act to provide a low turn-on voltage trigger for an SCR protecting device. The pads that interconnect a VLSI semiconductor chip with external circuits are typically provided with protection circuits that turn-on when an excessive voltage appears at a Pad, commonly caused by an ESD, to avoid possible internal damage to the chip circuits, such as the buffer circuits at an input Pad and the driver circuits at an output Pad. The protection circuit for CMOS devices may involve an SCR which is formed of a PNP bipolar transistor and an NPN bipolar transistor that are interconnected so that the emitter-collector circuit of each transistor conducts the base current of the other. When either transistor is turned ON, it turns ON the other and both stay ON until the current is interrupted. As noted above, the SCR is an ideal device for on-chip protection against ESD since in its ON state it protects sensitive devices by virtue of its comparatively low resistance, and the failure threshold of the SCR is high because the heat generation is distributed over a large volume. However, there are sensitive devices that are damaged at voltages less than the SCR trigger voltage, which typically is comparatively high, so that in order to protect devices such as NMOS transistors, which have the lowest breakdown voltage in CMOS technology, a reduction of the SCR trigger voltage to a level less than the NMOS breakdown voltage, may be achieved by the use of an NMOS-like structure incorporated in the SCR device as a trigger. Such a prior art arrangement is shown in FIG. 1.

Figure 1:
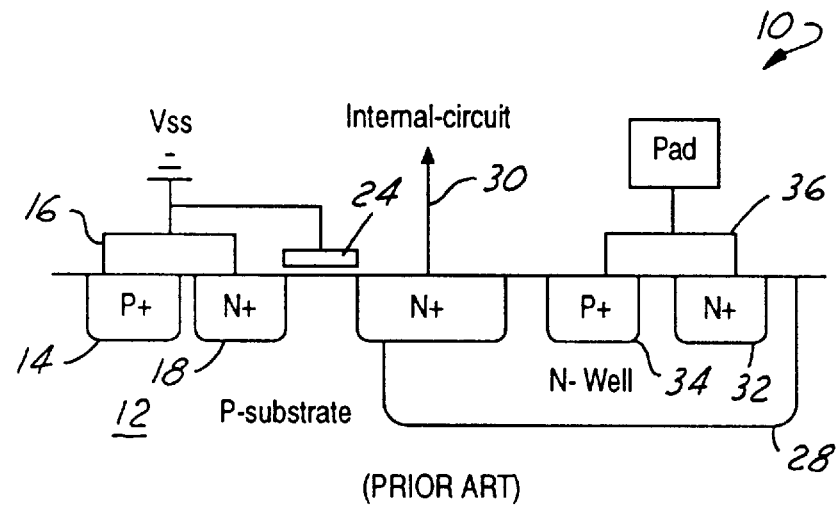
FIG. 1 is a diagramnmnatic illustration in section of a semiconductor device including a conventional ESD protection circuit.

Accordingly, a thin-oxide NMOS field-effect transistor (MOSFET) 26, is shown in the FIG. 1 LVTSCR in the form of an N-channel device, composed of N+ regions, 18 and 20, having a gate electrode 22 and a thin oxide 24 therebetween. The inner N+ region 20 of MOSFET 26 is connected to internal circuits 30 and its outer N+ region 18 is coupled to an adjacent outer P+ conductivity region 14 by a contact or bus 16 which is connected to a negative voltage source VSS or ground. The Vss source is also coupled to the gate electrode 22 to keep the LVTSCR OFF during normal operation. The N+ diffusion regions, 18 and 20, and underlying P-type substrate 12 act as a bipolar device when there is an excessive positive stress on the internal circuit 30 with respect to Vss, i.e., a parasitic lateral NPN transistor results, with its base at the substrate 12, its emitter at N+ region 18, and its collector or drain at N+ region 20. The NP junction (20,12) at the drain breaks down and the generated electrons are swept into the collector region 20. The generated holes injected into the base region 12 cause the substrate voltage to increase, forward biasing the emitter junction, and causing the NPN transistor to turn ON. The resulting current flow triggers the operation of the SCR. More particularly, the remaining portion of the LVTSCR involves an N-well 28, provided in substrate 12, substantially overlapping N+ region 20 and extending laterally beyond a second N+ region 32 which is coupled to an adjacent inner P+ conductivity region 34 by a contact or bus 36 connected to an I/O Pad. N-well 28 increases the junction breakdown voltage between N+ region 20 and the substrate 12, and alleviates the chances of contact spiking produced by the N+ junction and thus avoids short circuiting of the N+ junction to the P-substrate. Moreover, even were a breakdown to occur in the N+ junction, the increased cross-sectional area of the N-well 28 available for current flow decreases the current density and thus improves the ESD immunity. In this arrangement, the internal circuit connection acts as a "drain tap" and the N+ region 18 source as a cathode and the charge generated during avalanche breakdown near the drain tap triggers the LVTSCR. Thus, the NMOS-like device acts as a trigger for the SCR. Prior to the triggering, the LVTSCR characteristics resemble that of an NMOS with the same gate length, and since for short channel MOSFETs the drain breakdown voltage decreases with reduction of the gate length, if the gate length of the LVTSCR is kept less than that of an NMOS of the output buffer in parallel with it and at the same potential, then the LVTSCR will fire first and protect the NMOS.

However, there exists a danger, since the N-well is lightly doped, that the SCR turn-on voltage may still be so high that the gate oxide of NMOS devices may become damaged. It is therefore desirable to be able to reduce the trigger voltage required to turn ON a protective SCR as much as possible.

Figure 2:
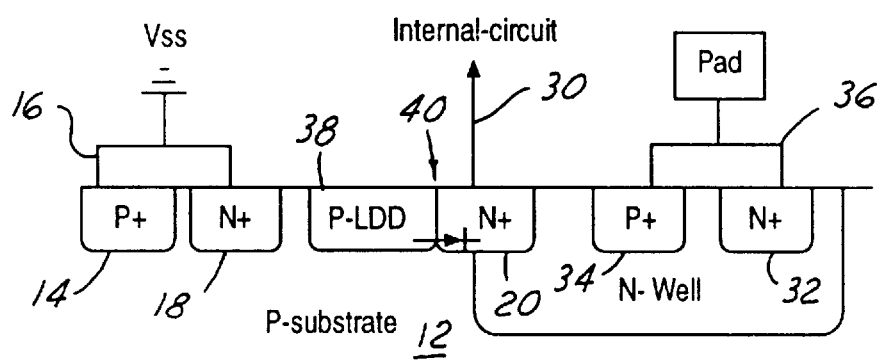
FIG. 2 is a diagrammatic illustration in section of a semiconductor device including an ESD protection circuit in accordance with the present invention.

Referring to FIG. 2, an arrangement for providing a low voltage trigger source for a protective SCR in accordance with the present invention is shown wherein an improved low voltage trigger source is produced for the SCR by forming an N+–P-LDD junction between the SCR and a CMOS device incorporated therein. In particular, the prior art N-channel device 26 used in triggering the known LVTSCR is modified by removing the gate electrode 22 and thin oxide 24, and implanting, adjacent the N+ drain region 20, a P-type lightly doped drain (P-LDD) region 38 in the substrate 12 to form an N+–P-LDD junction 40. The turn-on voltage of this N+–P-LDD junction 40 can be made lower than the oxide breakdown voltage of the CMOS devices by adjusting the P-LDD dosage, and the junction upon breakdown will support a high current flow. Junction breakdown causes a forward bias resulting in turn ON of the PNP bipolar device and the flow of base current causes the interconnected NPN bipolar device to turn ON triggering the operation of the SCR to produce a high current flow through the SCR and protect the other internal integrated devices.

The concern about damage to the gate oxide of the prior art NMOS trigger device is obviated as there is no longer a gate oxide. The P-LDD implantation may use boron ions, such as $B^{31}$ or $BF_2$, as the P-type ions, with energies in the range from about 40 Kev. to about 60 Kev. and a dosage of from $10^{11}$ to about $10^{15}$ ions/cm$^2$.

It will therefore be seen that an apparatus and method have been presented that enhance the operation of the ESD protective circuits in VLSI chips and particularly CMOS devices therein to prevent damage thereto. Whereas the conventional SCR ESD protection devices have their turn-on voltages dependent on the NMOS braekdown voltage, the device of the invention has its turn-on voltage dependent on the N+–P-LDD junction breakdown voltage, which offers improved control and the ability to reduce the voltage level.

While the present invention has been described in an illustrative manner, it should be understood that the terminology used is intended to be in the nature of words of description rather than of limitation.

Furthermore, while the present invention has been described in terms of a preferred embodiment, it is to be appreciated that those skilled in the art will readily apply these teachings to other possible variations within the scope of the invention.

The embodiments of the invention in which an exclusive property or privilege is claimed are defined in the following claims.

I claim:

1. Apparatus for enhancing the operation of an ESD protective circuit, including an SCR, in a VLSI chip having CMOS devices therein to prevent damage thereto, comprising:

a first outer region of one conductivity type and a first inner region of opposite conductivity type formed in a well region of one conductivity type disposed in a substrate of opposite conductivity type;

an I/O Pad contact coupling said first outer and inner regions and contacting said well region;

a second outer region of opposite conductivity type and a second inner region of one conductivity type disposed in said substrate;

a first contact connected to a voltage source and coupling said second outer region of opposite conductivity type and said second inner region of one conductivity type;

a third region of one conductivity type disposed partly in said well region and partly in said substrate between said first inner region of opposite conductivity type and said second inner region of one conductivity type;

a second contact coupled to internal circuits in said chip and connected to said third region; and a fourth region of opposite conductivity type disposed in said substrate adjacent to said third region to form a junction therewith and having a dosage to function as a lightly doped drain with respect to said second inner region to act as a trigger source for said SCR.

2. Apparatus as in claim 1 wherein said one conductivity type is N+ and said second conductivity type is P+.

3. Apparatus as in claim 1 wherein said fourth region comprises boron.

4. Apparatus as in claim 3 wherein said boron comprises ions of at least one of B$^-$ and BF$_2$.

5. Apparatus as in claim 4 wherein said boron ions have energies in the range from about 40 Kev. to about 60 Kev. and a dosage of from about $10^{11}$ to about $10^{15}$ ions/cm$^2$.

6. Apparatus for enhancing the operation of an ESD protective circuit, including an SCR, in a VLSI chip having CMOS devices therein to prevent damage thereto, comprising:

an I/0 Pad contact on said chip;

a first contact on said chip coupled to a Vss source;

a second contact on said chip coupled to internal circuits in said chip;

an N-well disposed in the P-type substrate of said chip;

a first outer P+ region and a first inner N+ region disposed in said chip substrate and connected to said first Vss contact;

a second outer N+ region and a second inner P+ region disposed in said N-well and connected to said I/0 Pad contact;

a third N+ region disposed partly in said N-well and partly in said substrate between said first inner N+ region and said second inner P+ region and connected to said second contact; and a fourth lightly doped P region disposed in said substrate adjacent to said third N+ region to form a junction therewith and having a dosage to function as a lightly doped drain with respect to said second inner N+ region to act as a trigger source for said SCR.

7. Apparatus as in claim 6 wherein said fourth lightly doped P region comprises boron.

8. Apparatus as in claim 7 wherein said boron comprises ions of at least one of B$^-$ and BF$_2$.

9. Apparatus as in claim 8 wherein said boron ions have energies in the range from about 40 Kev. to about 60 Kev. and a dosage of from about $10^{11}$ to about $10^{15}$ ions/cm$^2$.

10. A method for enhancing the operation of an ESD protective circuit, including an SCR in a VLSI chip having CMOS devices therein to prevent damage thereto, said chip comprising:

an outer P+ region and an inner N+ region disposed in a P-substrate with a first contact coupled to a Vss source above and connected therebetween;

an outer N+ region and an inner P+ region disposed in an N-well in said P-substrate and connected by an I/O Pad contact extending above and therebetween and contacting said N-well third N+ region disposed partly in said N-well and partly in said P-substrate between said inner P+ region and said inner N+ region and connected to the internal circuits in said chip;

wherein the improvement comprises the step of diffusing a lightly doped P region in said P-substrate adjacent said third N+ region to form a junction therewith and adjusting the dosage to cause said junction to act as a lightly doped drain with respect to said inner N+ region and a trigger source for said SCR.

11. The method of claim 10 wherein said step of diffusing said lightly doped P region comprises adjusting the dosage to adjust the junction breakdown voltage.

12. The method of claim 10 wherein said step of diffusing said lightly doped P region comprises doping with boron.

13. The method of claim 12 wherein said boron comprises ions of at least one of $B^-$ and $BF_2$.

14. The method of claim 13 wherein said boron ions have energies in the range from about 40 Kev. to about 60 Kev. and a dosage of from about $10^{11}$ to about $10^{15}$ ions/cm$^2$.

* * * * *